US011835998B2

(12) United States Patent
Mehra et al.

(10) Patent No.: US 11,835,998 B2
(45) Date of Patent: Dec. 5, 2023

(54) SYSTEM AND METHOD FOR ENABLING CLOCK STRETCHING DURING OVERCLOCKING IN RESPONSE TO VOLTAGE DROOP

(71) Applicant: Advanced Micro Devices, Inc., Santa Clara, CA (US)

(72) Inventors: Amitabh Mehra, Fort Collins, CO (US); Jerry A. Ahrens, Sister Bay, WI (US); Anil Harwani, Austin, TX (US); Richard Martin Born, Fort Collins, CO (US); Dirk J. Robinson, Fort Collins, CO (US); William R. Alverson, Austin, TX (US); Joshua Taylor Knight, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 17/362,231

(22) Filed: Jun. 29, 2021

(65) Prior Publication Data
US 2022/0413543 A1 Dec. 29, 2022

(51) Int. Cl.
*G06F 1/08* (2006.01)
*G06F 1/28* (2006.01)
*H03K 5/00* (2006.01)

(52) U.S. Cl.
CPC .............. *G06F 1/08* (2013.01); *G06F 1/28* (2013.01); *H03K 5/00006* (2013.01)

(58) Field of Classification Search
CPC .......... G06F 1/08; G06F 1/28; H03K 5/00006
See application file for complete search history.

(56) References Cited

U.S. PATENT DOCUMENTS

| 7,382,366 | B1 | 6/2008 | Klock et al. | |
|---|---|---|---|---|
| 10,466,737 | B2* | 11/2019 | Han | G06F 1/266 |
| 2006/0020838 | A1* | 1/2006 | Tschanz | G06F 1/206 |
| | | | | 713/322 |
| 2010/0281278 | A1 | 11/2010 | Hsiao | |
| 2012/0187991 | A1 | 7/2012 | Sathe et al. | |
| 2015/0002197 | A1 | 1/2015 | Chatterjee et al. | |

(Continued)

OTHER PUBLICATIONS

International Search Report and Written Opinion, PCT/US2022/034192, dated Oct. 17, 2022, 11 pages.

(Continued)

*Primary Examiner* — Zahid Choudhury

(57) ABSTRACT

Methods and apparatuses control the clock rate of a processing unit. The methods and apparatus control the clock rate by generating an output clock rate based on the determined frequency adjustment such that the processing unit maintains the overclocking. The methods include: receiving an analog voltage supply in response to detecting overclocking in the processing unit; dynamically sensing measurements of an output voltage from a voltage generator based on the received analog voltage supply; determining characteristics of a voltage droop in the output voltage based on the dynamically sensed output voltage measurements; determining a frequency adjustment for the clock rate of the processing unit based on the determined characteristics of the voltage droop; and generating an output clock rate based on the determined frequency adjustment such that the processing unit maintains the overclocking.

25 Claims, 5 Drawing Sheets

(56) References Cited

U.S. PATENT DOCUMENTS

| | | | |
|---|---|---|---|
| 2016/0019181 A1* | 1/2016 | Tan | G06F 1/08 |
| | | | 710/300 |
| 2018/0018009 A1 | 1/2018 | Kommrusch et al. | |
| 2019/0265767 A1* | 8/2019 | Mehra | G06F 1/324 |
| 2020/0007082 A1* | 1/2020 | Robinson | H03B 5/06 |
| 2022/0019258 A1* | 1/2022 | Remple | H03L 7/0992 |

OTHER PUBLICATIONS

Shang Xinchao et al., Low Overhead and Fast Reaction Adaptive Clocking System for Voltage Droop Tolerance, Chinese Journal of Electronics, Technology Exchange LTD, Hong Kong, HK, vol. 28, No. 3, May 2019, XP006080656, ISSN: 1022-4653, DOI: 10.1049 / CJE.2019.02.009, 5 pages.

* cited by examiner

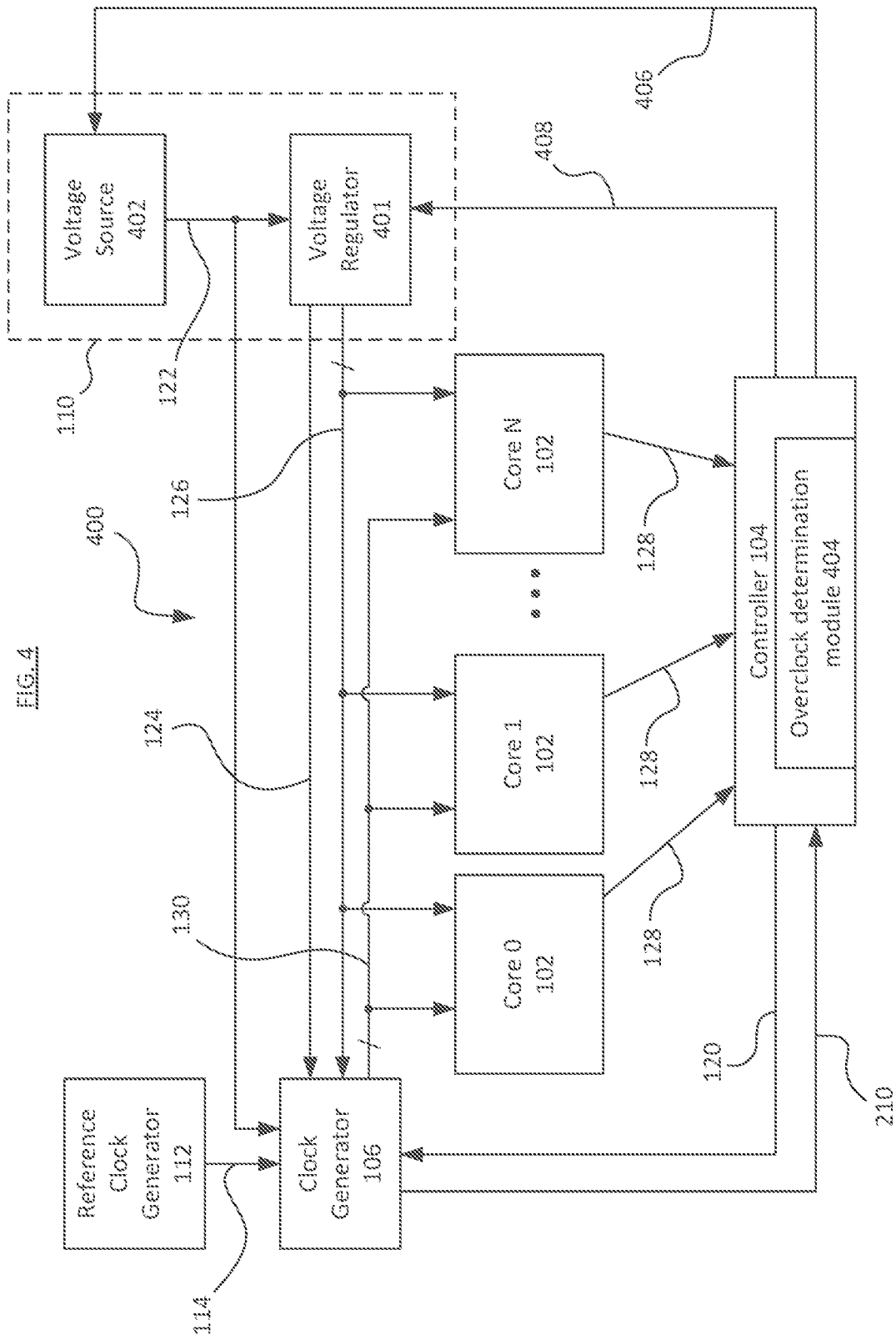

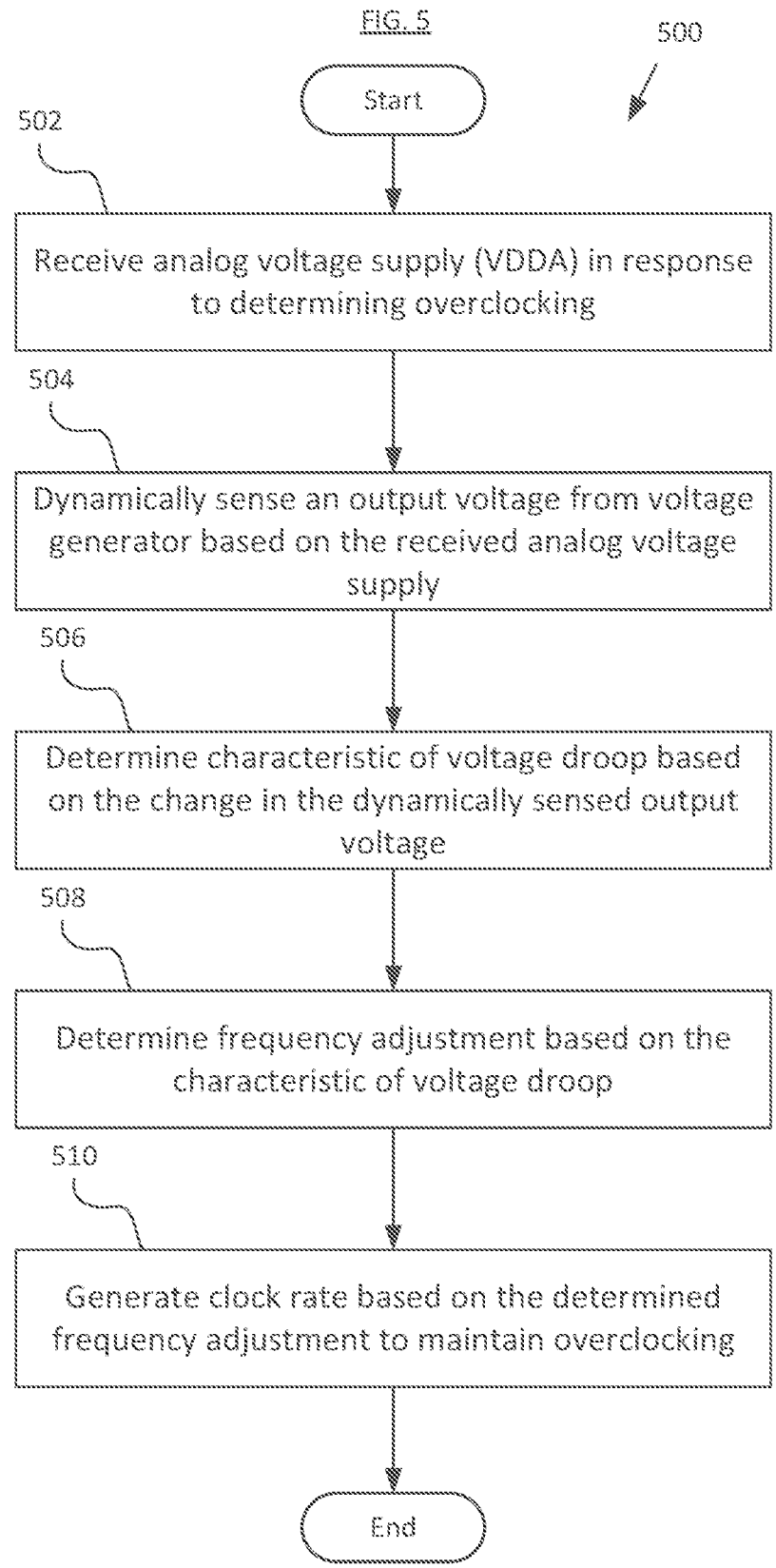

SYSTEM AND METHOD FOR ENABLING CLOCK STRETCHING DURING OVERCLOCKING IN RESPONSE TO VOLTAGE DROOP

BACKGROUND OF THE DISCLOSURE

Processing units in an integrated circuit consume a variable amount of power depending on the processes that are executing on the processing unit. A processing unit consumes very little power while in the idle state, but power consumption increases rapidly when the processing unit is required to perform an action. Some operations require more power than others, and in cases where higher performance is demanded from the processing units, clock rates of the processing units can be increased such that the processing units are running at a frequency higher than specified, also known as "overclocking." The overclocking states typically have a higher operating voltage.

One factor that negatively affects the power integrity of the circuit is the occurrence of supply voltage droops. A supply voltage droop is a temporary drop or reduction in a supply voltage provided by a power supply to one or more elements in a circuit, such as a transistor. Supply voltage droops can be the result of a drop in supply voltage provided to the power supply, an operational change to the power supply, a surge in power supply current provided by the power supply, or any combination thereof.

The power supply droops created by changes in power draw from power supply can result in degradation of the maximum clock frequency or increase in voltage needed to operate the processing units required for a particular frequency. The impact of power supply droop can be reduced by stretching the clock upon detection of power supply droop. However, in prior art implementations, if the processing units are detected as operating at an overclocking state, clock stretching is disabled in order to maintain a fixed frequency during overclocking because the voltage range and the frequency range during overclocking are much higher than normal, thus requiring greater voltage and frequency range capabilities. As such, there is a need to reduce the impact of power supply droop even when the processing units are operating at the overclocking state.

BRIEF DESCRIPTION OF THE DRAWINGS

The implementations will be more readily understood in view of the following description when accompanied by the below figures, wherein like reference numerals represent like elements, and wherein:

FIG. 4 is an example functional block diagram of a multi-processor core system according to embodiments disclosed herein; and FIG. 5 is an example flow diagram of a process implemented in the processor system according to embodiments disclosed herein.

DETAILED DESCRIPTION OF IMPLEMENTATIONS

Figure 1:
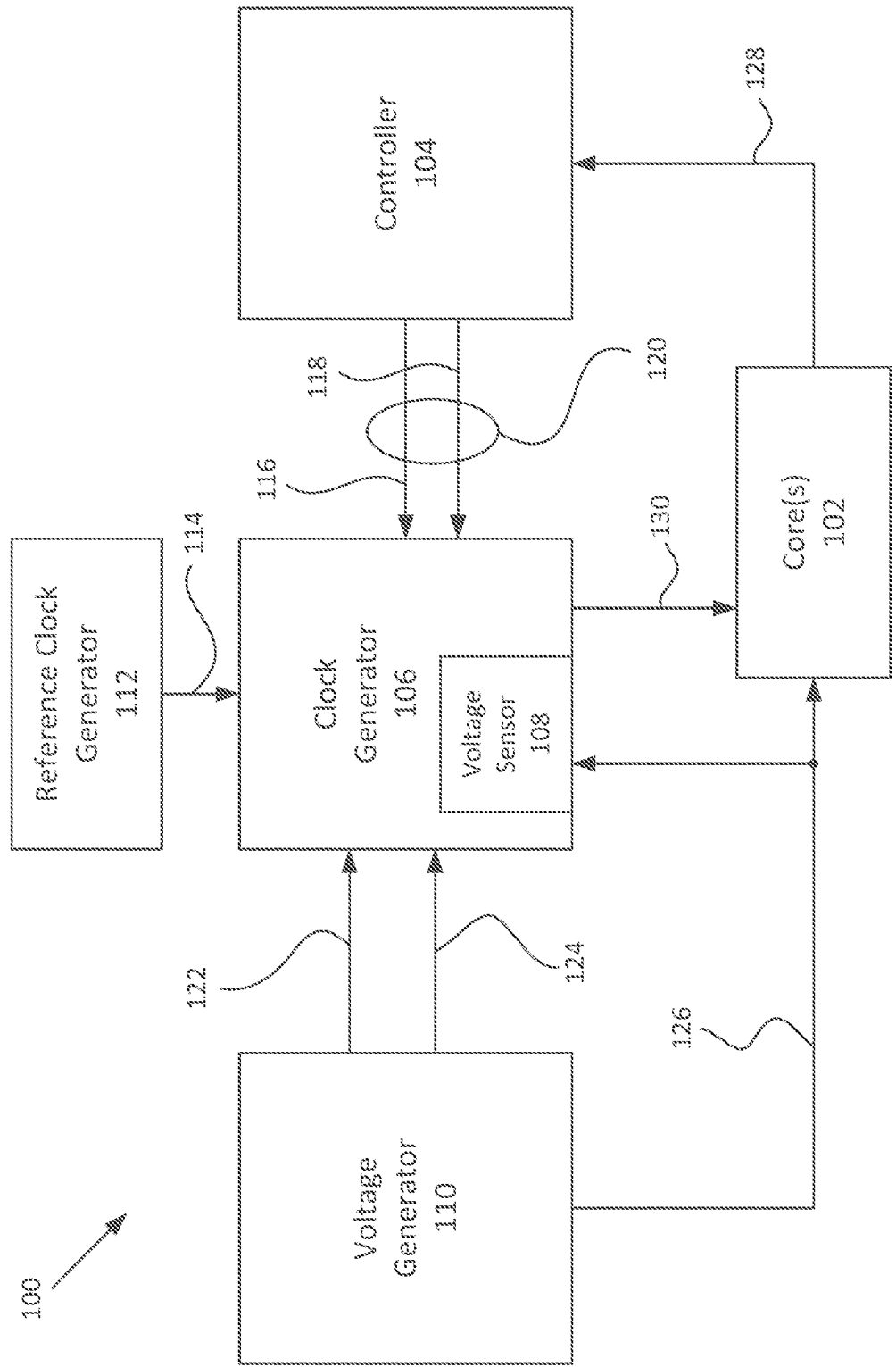
FIG. 1 is an example functional block diagram of a processor system according to embodiments disclosed herein.

Briefly, systems and methods help control the clock rate of a processing unit by generating an output clock rate based on the determined frequency adjustment such that the processing unit maintains the overclocking. In some examples, the methods include: receiving an analog voltage supply in response to detecting overclocking in the processing unit; dynamically sensing measurements of an output voltage from a voltage generator based on the received analog voltage supply; determining characteristics of a voltage droop in the output voltage based on the dynamically sensed output voltage measurements; determining a frequency adjustment for the clock rate of the processing unit based on the determined characteristics of the voltage droop; and generating an output clock rate based on the determined frequency adjustment such that the processing unit maintains the overclocking.

In some examples of the methods, the frequency adjustment is determined to compensate for the voltage droop during overclocking based on the characteristics of the voltage droop. In some examples, the characteristics of the voltage droop includes a change in the output voltage and a rate of change of the output voltage. In some examples, the output clock rate is further adjusted based on the output voltage. In some examples, the overclocking in the processing unit is configured to be detected at initial system startup.

In some examples, the overclocking in the processing unit is configured to be detected in response to an adjustment request from a system firmware operably coupled with the processing unit. In some examples, the overclocking in the processing unit is configured to be detected in response to an adjustment request from an user input. In some examples, the overclocking in the processing unit is configured to be detected in response to an adjustment request based on a feedback from the processing unit. In some examples, the adjustment request is based on the generated output clock rate.

According to certain implementations, a clock generator includes a voltage sensor, an oscillation adjustment module, and a clock oscillator. The voltage sensor receives an analog voltage supply from a voltage generator, and dynamically senses measurements of an output voltage from the voltage generator based on the received analog voltage supply. The oscillation adjustment module is operably coupled with the voltage sensor and also receives an indication of overclocking in a processing unit, receives the dynamically sensed output voltage measurements from the voltage sensor, determines characteristics of a voltage droop in the output voltage based on the dynamically sensed output voltage measurements, and determines a frequency adjustment for the clock rate of the processing unit based on the determined characteristics of the voltage droop. The clock oscillator is operably coupled with the oscillation adjustment module and also receives the frequency adjustment from the oscillation adjustment module, and generates an output clock rate based on the determined frequency adjustment such that the processing unit maintains the overclocking.

In some examples of the clock generator, the frequency adjustment is determined to compensate for the voltage droop based on the characteristics of the voltage droop. In some examples, the characteristics of the voltage droop includes a change in the output voltage and a rate of change of the output voltage. In some examples, the overclocking in the processing unit is configured to be detected in response to an adjustment request based on a feedback from the processing unit. In some examples, the adjustment request is based on the generated output clock rate.

In some embodiments, the clock generator further includes a clock buffer that is operably coupled with the clock oscillator. The clock buffer receives the output clock rate from the clock oscillator, receives the output voltage from the voltage generator, and adjusts the received output clock rate based on the output voltage.

According to certain implementations, a system includes a voltage generator, at least one processing unit, a controller, and a clock generator. The voltage generator generates an output voltage for the processing unit based on an analog voltage supply. The processing unit receives the output voltage from the voltage generator. The clock generator is coupled with the voltage generator, the at least one processing unit, and the controller. The clock generator receives the analog voltage supply from the voltage generator and an indication of overclocking from the controller, dynamically senses measurements of the output voltage from the voltage generator based on the received analog voltage supply, determines characteristics of a voltage droop in the output voltage based on the dynamically sensed output voltage measurements, determines a frequency adjustment for the clock rate of the processing unit based on the determined characteristics of the voltage droop, and generates an output clock rate based on the determined frequency adjustment such that the processing unit maintains the overclocking.

In some embodiments, the voltage generator includes a voltage supply and a voltage regulator, and the controller of the system includes an overclock determination module. The overclock determination module determines the overclocking in the processing unit based on measured frequency and frequency adjustment values detected from the processing unit, sends a voltage supply signal to the voltage supply to change the provided analog voltage supply, send an output voltage signal to the voltage regulator to change the provided output voltage, and sends overclock parameters to the clock generator reflecting the changes in the analog voltage supply and the output voltage.

In some examples of the embodiments, the frequency adjustment is determined to compensate for the voltage droop based on the characteristics of the voltage droop. In some examples, the characteristics of the voltage droop includes a change in the output voltage and a rate of change of the output voltage. In some examples, the clock generator can further adjust the received output clock rate based on the output voltage.

In some examples, the controller sets the overclocking at an initial startup of the system. In some examples, the controller sets the overclocking in response to an adjustment request for increased performance from the processing unit. In some examples, the controller sets the overclocking in response to an adjustment request from an user input. In some examples, the controller sets the overclocking in response to an adjustment request based on a feedback from the processing unit. In some examples, the adjustment request is based on the generated output clock rate.

In the following description, numerous specific details are set forth to provide a thorough understanding of the methods and mechanisms presented herein. However, one having ordinary skill in the art should recognize that the various embodiments can be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements can be exaggerated relative to other elements.

FIG. 1 illustrates a high-level view of an exemplary processor system 100 which according to embodiments disclosed herein. The system 100 includes one or more cores (only one core 102 is shown for simplicity) that are coupled with a system firmware such as a controller 104 via a data communication bus to transmit information to and from the core 102 and the controller 104. The system 100 also includes a clock generator 106, which can be a phase-locked loop (PLL) or frequency-locked loop (FLL) for example, with a voltage sensor 108 implemented therewith, as well as a voltage generator 110 and a reference clock generator 112. The controller 104 can be implemented in any suitable manner such as one or more state machines, a programmable processor and/or a combination of processor executing software instructions and one or more state machines.

The clock generator 106 receives a plurality of inputs, including: a reference clock signal 114 from the reference clock generator 112; an analog voltage supply value (also referred to as VDDA) 116 and an input voltage value 118, which are collectively referred to as overclock parameters 120, from the controller 104; and an analog voltage supply 112 and an input voltage 124. The voltage sensor 108 coupled with the clock generator 106 is capable of sensing and taking measurements of an output voltage 126 supplied from the voltage generator 110 to the core 102. The voltage sensor 108 can be implemented in the clock generator 106 or externally located but operatively coupled with the clock generator 106.

The controller 104 determines the overclock parameters 120 based on measured frequency 128 in the core 102, and in some examples also any frequency adjustments made to the clocking rate of the core 102, as further explained herein. Based on the aforementioned inputs, the clock generator 106 generates an output clock 130 adjusted from the original reference clock signal 114. The output clock 130 determines the operating frequency of the core 102.

Figure 2:
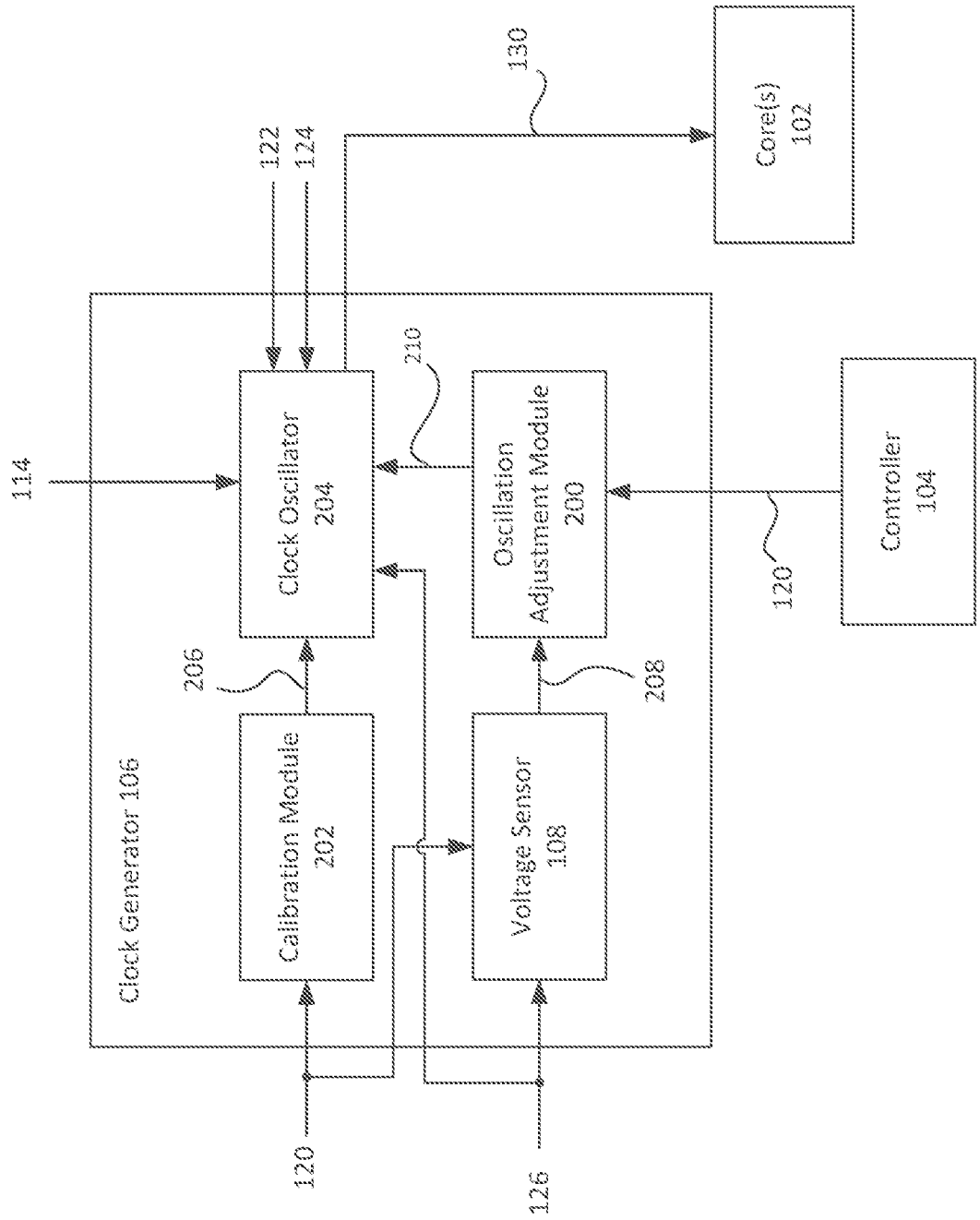
FIG. 2 is an example functional block diagram of a clock generator implemented in the processor system of FIG. 1 according to embodiments disclosed herein.

FIG. 2 illustrates a high-level view of the exemplary clock generator 106 according to embodiments disclosed herein. The clock generator 106 has three components: an oscillation adjustment module 200, a calibration module 202, and a clock oscillator 204. The oscillation adjustment module 200 is coupled with the controller 104 to receive therefrom the overclock parameters 120, and also coupled with the voltage sensor 108 to receive therefrom sensed output voltage 208 based on the output voltage 126 provided from the voltage generator 110. The calibration module 202 is also coupled with the controller 104 to receive therefrom the overclock parameters 120 and generates corrected calibration values 206. The corrected calibration values 206 are the corrected voltage values for programming the clock oscillator 204, which includes an adaptive oscillator circuit.

The voltage sensor 108, which can be part of the clock generator 106 or an external device coupled therewith, receives the output voltage 126 provided to the core 102 as well as the overclock parameters 120, or more specifically at least the analog voltage supply VDDA 122 of from the voltage generator 110, or more specifically the analog voltage source. The voltage sensor 108 compares the output voltage 126 with the VDDA 122 to detect any voltage droop in the output voltage 126.

In prior art implementations, a voltage sensor receives only the output voltage and compares it with a predetermined reference VDDA value, which is less accurate than comparing the output voltage directly with the VDDA that is provided. As such, the voltage sensor 108 as disclosed herein facilitates a dynamic means of sensing voltage droop in the output voltage 126, by implementing a flexible output-voltage-to-VDDA comparison that is not based on a predetermined reference VDDA value as known in the art. An advantage of implementing such means is the reduction of a margin of error corresponding to the voltage droop estimation provided by the voltage sensor 108.

The voltage sensor 108 generates a sensed output voltage 208 which includes the detection of any voltage droop in the output voltage 126. The oscillation adjustment module 200 receives the sensed output voltage 208 as well as the overclock parameters 120 and generates a frequency adjustment 210 based on the inputs, which includes instructions to implement any clock stretch (that is, stretching the reference clock 114) to reduce the impact of the voltage droop. The clock oscillator 204 receives the reference clock signal 114 and the frequency adjustment 210, as well as the output voltage 126, the corrected calibration values 206, the VDDA 12, and the input voltage 124 from the voltage generator 110, for example. Based on these inputs, the clock oscillator 204 generates the output clock 130 for the core 120.

In the embodiments disclosed herein, the clock generator 106 detects the indication of overclocking via the overclock parameters 120, and the voltage sensor 108 detects the indication of voltage droop. The clock oscillator 204 generates the output clock 130 such that the reference clock 114 is stretched to reduce the impact of the voltage droop while maintaining the core 102 to operate in the overclocking state, that is, without reducing the operating frequency or clock rate of the core 102. As such, the clock stretching only causes a delay in the clock signal without slowing down the clock rate. With such implementation, the core 102 is capable of maintaining operation at higher performance facilitated by the overclocking while the effects of voltage droop from the voltage generator 110 is reduced.

Figure 3:
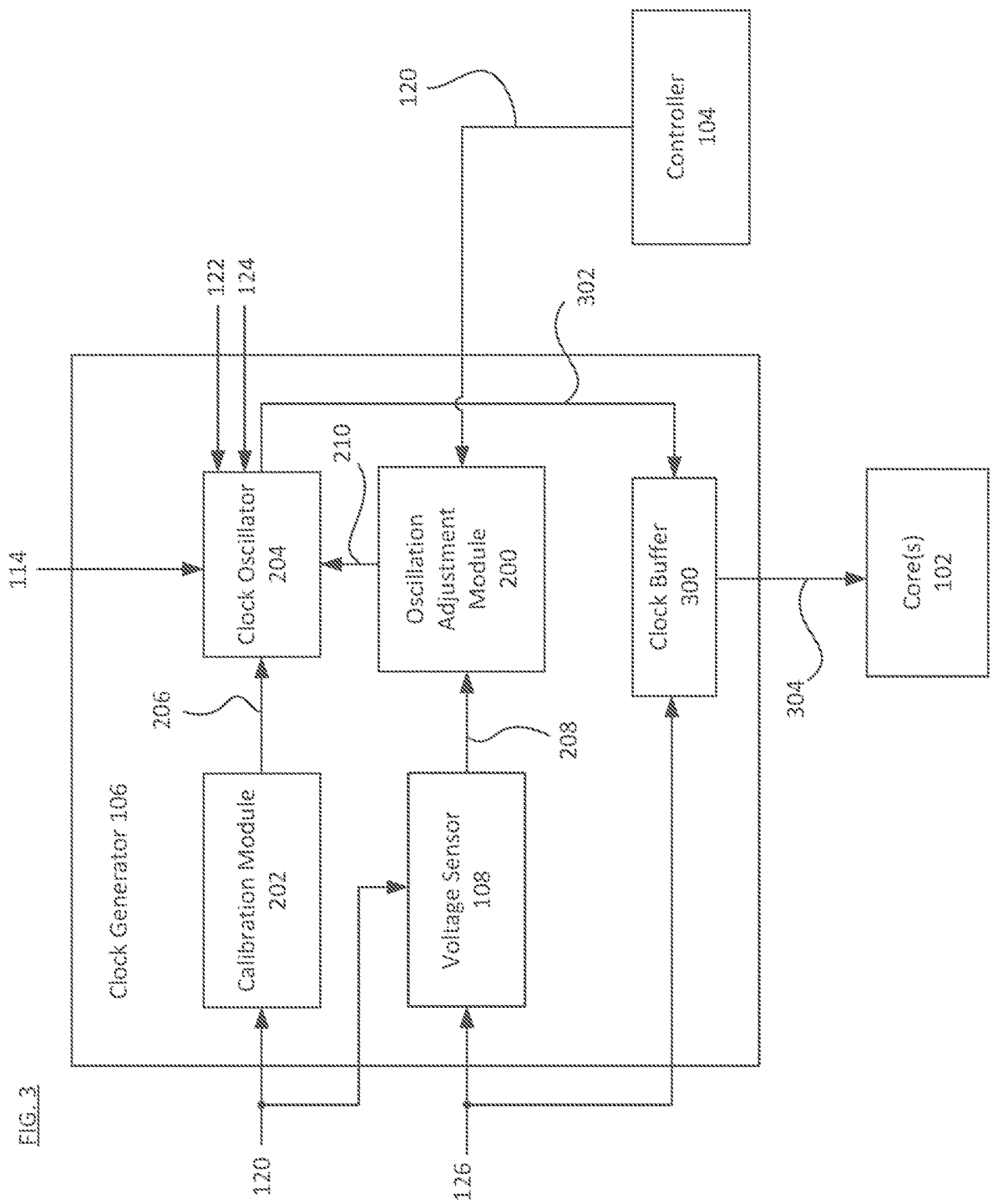
FIG. 3 is another example functional block diagram of the clock generator implemented in the processor system of FIG. 1 according to embodiments disclosed herein.

FIG. 3 illustrates another high-level view of the exemplary clock generator 106 according to embodiments disclosed herein. The clock generator 106 includes a clock buffer 300, e.g. a set of inverters, amplifiers, CML buffers, etc., which receives the output voltage 126, instead of the clock oscillator 204 receiving the output voltage 126 as shown in FIG. 2. Because the clock oscillator 204 does not receive the output voltage 126, the generated output clock is an unbuffered output clock 302, which is received by the clock buffer 300 to generate a buffered output clock 304 to be used by the core 102, or a plurality of cores. The clock buffer 300 can be any suitable type of buffer which facilitates distributing multiple copies of a clock to multiple cores with the same frequency requirements, in order to save spaces and costs by eliminating additional timing components, external voltage dividers, or signal-level transition circuits, for example.

FIG. 4 is a block diagram of one embodiment of an exemplary multi-processor core system 400 according to embodiments disclosed herein. The system 400 includes a total of N+1 cores 102 from core 0 to core N, which can be implemented in a common integrated circuit. The voltage generator 110 in the embodiment includes an analog voltage source 402, e.g. a VDDA 1.8V power supply, which is coupled with a voltage regulator 401 such that the VDDA 122 is provided to the voltage regulator 401 for the regulated voltage to be distributed to each of the cores 102, as well as to the clock generator 106 as an input. The voltage regulator 401 uses the supplied VDDA 122 to supply an output voltage 126 to each of the cores 102 as well as to the clock generator 106, or more specifically to the voltage sensor 108 coupled with the clock generator 106. The voltage generator 110 can be implemented in the integrated circuit which includes the cores 102 or implemented separately from the integrated circuit, as suitable. The voltage generator 110 provides the output voltage 126 that is variable according to the voltage level selected by the controller 104.

The system 400 also includes the controller 104 coupled to each of the cores 102 which receives the measured frequency 128 of each core 102 and in some cases also the frequency adjustment 210 from the cores 102, although the frequency adjustment 210 can alternatively be provided directly by the clock generator 106 as shown. The controller 104 also includes an overclock determination module 404 which determines whether to implement overclocking to increase performance of the cores 102 based on the present measured frequency 128 and the frequency adjustment 210. For example, the determination of overclocking can be in the form of changing a performance state (P-state) of the cores 102, as will be further discussed herein.

In response to determining by the overclock determination module 404 that overclocking is to be enabled, the controller 104 sends an analog voltage supply change signal 406 to the voltage source 402 as well as an input voltage change signal 408 to the voltage generator 110. The signals 406 and 408 include the values of the input voltage and VDDA as newly set by the controller 104, which are relayed to the clock generator 106 in the form of the overclock parameters 120.

In some examples, the overclock determination module 404 enables overclocking at initial system startup, that is, when the system 400 is powered up to start operation. In some examples, the overclock determination module 404 provides an adjustment request, which includes the signals 406 and 408 indicative of overclocking, based on factors such as the types of software or hardware application operating using the cores 102. Such applications can include system-intensive applications such as games that incorporate different subsystems on the computer such as hard drive, graphics, memory, and CPU, or CPU-intensive applications such as multithreaded applications including but not limited to photo editing and video transcoding applications. In some examples, the adjustment request can be provided directly via user input, for example via a user interface, when the user wishes for an increase in the system performance. In some examples, the adjustment request can be based on a feedback from the processing unit, e.g. a feedback based on the generated output clock rate, such as the cores detecting a potential need for an increase in operating frequency in order to accommodate for increased performance requirements. Any other suitable situations can be considered with regards to when and how such adjustment requests can be generated by the overclock determination module 404.

The system 400 can be any type of processor system such as a central processing unit (CPU) or a graphics processing unit (GPU). For example, the system 400 can be implemented as an x86 processor with x86 64-bit instruction set architecture and is used in desktops, laptops, servers, and superscalar computers; an Advanced Reduced Instruction Set Computer (RISC) Machine (ARM) processor that is used in mobile phones or digital media players; or a digital signal processor (DSP) that is useful in the processing and implementation of algorithms related to digital signals, such as voice data and communication signals, and microcontrollers that are useful in consumer applications, such as printers and copy machines.

The cores 102 form the computational centers of the system 400 and are responsible for performing a multitude of computational tasks. For example, the processor cores 102 can include, but are not limited to, execution units that perform additions, subtractions, shifting and rotating of binary digits, and address generation and load and store units that perform address calculations for memory addresses and the loading and storing of data from memory. The operations performed by the processor cores 102 enable the running of computer applications.

The processor cores 102 operate according to certain performance states (P-states) as controlled by the controller 104. P-states are described as follows. The Advanced Configuration and Power Interface (ACPI) standard is an operating system-based specification that regulates a computer system's power management. For example, the ACPI standard can control and direct the processor cores for better management of battery life. In doing so, ACPI assigns processor power states, referred to as C-states, and forces a processor to operate within the limits of these states. There are varying levels of C-states (e.g., C0 for a fully working state, with full power consumption and full dissipation of energy; C1 for a sleeping state, where execution of instructions are stopped and the processor can return to execute instructions instantaneously; or C2 for another sleeping state where the processor can take longer to go back to C0 state) that a processor can be assigned, along with the corresponding implication for a processor's performance.

While a processor is in the fully working C0 state, it will be associated with another state, referred to as the performance state or the P-state. There are varying levels of P-states that are each associated with an operating voltage and frequency. The highest performance state is P0, which can correspond to maximum operating power, voltage and frequency. However, a processor can be placed in lower performance states, for example P1 or P2, which correspond to lower operating power, voltage and/or frequency. Generally, when a processor moves to a lower P-state it will operate at a lower capacity than before.

FIG. 5 is a flow diagram of an exemplary process 500 performed by an exemplary clock generator, for example, according to embodiments disclosed herein. In step 502 of the process 500, the analog voltage supply VDDA is received in response to determining that the processor core is operating at an overclocking state. In step 504, the output voltage as provided by the voltage generator is dynamically sensed based on the received analog voltage supply VDDA.

In step 506, one or more characteristics of the voltage droop are determined based on the changes in the dynamically sensed output voltage with respect to the analog voltage supply VDDA. That is, the VDDA values are compared with the output voltage values to determine if there is any voltage droop present in the output voltage; if there is voltage droop, any characteristics of the voltage droop are also determined such that the frequency adjustment can be determined to compensate for the voltage droop based on the characteristics of the voltage droop. The characteristics can include the amount of voltage reduction caused by the voltage droop, as well as the rate at which the reduction is taking place, i.e. the steepness in the rate of change of the output voltage.

In step 508, the frequency adjustment is determined based on the characteristic(s) of the voltage droop such that the clock rate that is adjusted based on the frequency adjustment facilitates reducing the effects of voltage droop in view of the voltage droop characteristics. In step 510, the new clock rate is generated based on the determined frequency adjustment such that the processor core maintains the overclock state while the effect of voltage droop is mitigated.

Although features and elements are described above in particular combinations, each feature or element can be used alone without the other features and elements or in various combinations with or without other features and elements. The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be mask works that are then used in a semiconductor manufacturing process to manufacture a processor which implements aspects of the embodiments.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

In the preceding detailed description of the various embodiments, reference has been made to the accompanying drawings which form a part thereof, and in which is shown by way of illustration specific preferred embodiments in which the invention can be practiced. These embodiments are described in sufficient detail to enable those skilled in the art to practice the invention, and it is to be understood that other embodiments can be utilized, and that logical, mechanical and electrical changes can be made without departing from the scope of the invention. To avoid detail not necessary to enable those skilled in the art to practice the invention, the description can omit certain information known to those skilled in the art. Furthermore, many other varied embodiments that incorporate the teachings of the disclosure can be easily constructed by those skilled in the art. Accordingly, the present invention is not intended to be limited to the specific form set forth herein, but on the contrary, it is intended to cover such alternatives, modifications, and equivalents, as can be reasonably included within the scope of the invention. The preceding detailed description is, therefore, not to be taken in a limiting sense, and the scope of the present invention is defined only by the appended claims. The above detailed description of the embodiments and the examples described therein have been presented for the purposes of illustration and description only and not by limitation. For example, the operations described are done in any suitable order or manner. It is therefore contemplated that the present invention covers any and all modifications, variations or equivalents that fall within the scope of the basic underlying principles disclosed above and claimed herein.

The above detailed description and the examples described therein have been presented for the purposes of illustration and description only and not for limitation.

What is claimed is:

1. A method of controlling a clock rate of a processing unit, comprising:
   receiving an analog voltage supply to a voltage generator in response to detecting overclocking in the processing unit;
   dynamically sensing measurements of an output voltage from the voltage generator based on the received analog voltage supply;
   determining characteristics of a voltage droop in the output voltage based on the dynamically sensed output voltage measurements;
   determining a frequency adjustment for the clock rate of the processing unit based on the determined characteristics of the voltage droop; and
   generating an output clock rate based on the determined frequency adjustment such that the processing unit maintains the overclocking.

2. The method of claim 1, wherein the frequency adjustment is determined to compensate for the voltage droop based on the characteristics of the voltage droop.

3. The method of claim 1, wherein the characteristics of the voltage droop includes a change in the output voltage and a rate of change of the output voltage.

4. The method of claim 1, wherein the output clock rate is further adjusted based on the output voltage.

5. The method of claim 1, wherein the overclocking in the processing unit is configured to be detected at initial system startup.

6. The method of claim 1, wherein the overclocking in the processing unit is configured to be detected in response to an adjustment request from a system firmware operably coupled with the processing unit.

7. The method of claim 1, wherein the overclocking in the processing unit is configured to be detected in response to an adjustment request from an user input.

8. The method of claim 1, wherein the overclocking in the processing unit is configured to be detected in response to an adjustment request based on a feedback from the processing unit.

9. The method of claim 8, wherein the adjustment request is based on the generated output clock rate.

10. A clock generator comprising:
    a voltage sensor configured to:
       receive an analog voltage supply to a voltage generator, and
       dynamically sense measurements of an output voltage from the voltage generator based on the received analog voltage supply;
    an oscillation adjustment module operably coupled with the voltage sensor, the oscillation adjustment module configured to:
       receive an indication of overclocking in a processing unit,
       receive the dynamically sensed output voltage measurements from the voltage sensor,
       determine characteristics of a voltage droop in the output voltage based on the dynamically sensed output voltage measurements, and
       determine a frequency adjustment for the clock rate of the processing unit based on the determined characteristics of the voltage droop; and
    a clock oscillator operably coupled with the oscillation adjustment module, the clock oscillator configured to:
       receive the frequency adjustment from the oscillation adjustment module, and generate an output clock rate based on the determined frequency adjustment such that the processing unit maintains the overclocking.

11. The clock generator of claim 10, wherein the frequency adjustment is determined to compensate for the voltage droop based on the characteristics of the voltage droop.

12. The clock generator of claim 10, wherein the characteristics of the voltage droop includes a change in the output voltage and a rate of change of the output voltage.

13. The clock generator of claim 10, further comprising a clock buffer operably coupled with the clock oscillator, the clock buffer configured to:
    receive the output clock rate from the clock oscillator,
    receive the output voltage from the voltage generator, and
    adjust the received output clock rate based on the output voltage.

14. The clock generator of claim 10, wherein the overclocking in the processing unit is configured to be detected in response to an adjustment request based on a feedback from the processing unit.

15. The clock generator of claim 14, wherein the adjustment request is based on the generated output clock rate.

16. A system comprising:
    a voltage generator configured to generate an output voltage based on an analog voltage supply;
    at least one processing unit configured to receive the output voltage from the voltage generator;
    a controller; and
    a clock generator operably coupled with the voltage generator, the at least one processing unit, and the controller, the clock generator configured to:
       receive the analog voltage supply from the voltage generator and an indication of overclocking from the controller,
       dynamically sense measurements of the output voltage from the voltage generator based on the received analog voltage supply,
       determine characteristics of a voltage droop in the output voltage based on the dynamically sensed output voltage measurements,
       determine a frequency adjustment for a clock rate of the processing unit based on the determined characteristics of the voltage droop,
       generate an output clock rate based on the determined frequency adjustment, such that the processing unit maintains the overclocking.

17. The system of claim 16, wherein the voltage generator further comprises a voltage supply and a voltage regulator, the controller comprises an overclock determination module configured to:
    determine the overclocking in the processing unit based on measured frequency and frequency adjustment values detected from the processing unit,
    send a voltage supply signal to the voltage supply to change the analog voltage supply,
    send an output voltage signal to the voltage regulator to change the output voltage, and
    send overclock parameters to the clock generator reflecting the changes in the analog voltage supply and the output voltage.

18. The system of claim 16, wherein the frequency adjustment is determined to compensate for the voltage droop based on the characteristics of the voltage droop.

19. The system of claim 16, wherein the characteristics of the voltage droop includes a change in the output voltage and a rate of change of the output voltage.

20. The system of claim 16, the clock generator further configured to adjust the received output clock rate based on the output voltage.

21. The system of claim 16, wherein the controller is configured to set the overclocking at an initial startup of the system.

22. The system of claim 16, wherein the controller is configured to set the overclocking in response to an adjustment request for increased performance from the processing unit.

23. The system of claim 16, wherein the controller is configured to set the overclocking in response to an adjustment request from an user input.

24. The system of claim 16, wherein the controller is configured to set the overclocking in response to an adjustment request based on a feedback from the processing unit.

25. The system of claim 24, wherein the adjustment request is based on the generated output clock rate.

\* \* \* \* \*